(12) United States Patent
Maeda et al.

(10) Patent No.: US 8,022,763 B2
(45) Date of Patent: Sep. 20, 2011

(54) AMPLIFIER FAILURE DETECTION APPARATUS

(75) Inventors: Hiroaki Maeda, Kawasaki (JP); Takashi Ono, Kawasaki (JP); Yousuke Okazaki, Kawasaki (JP); Hirotake Honda, Kawasaki (JP); Hiroyuki Ezuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 765 days.

(21) Appl. No.: 11/790,384

(22) Filed: Apr. 25, 2007

(65) Prior Publication Data

US 2008/0068191 A1   Mar. 20, 2008

(30) Foreign Application Priority Data

Sep. 19, 2006 (JP) ................. 2006-252135

(51) Int. Cl.
*H03F 21/00* (2006.01)
(52) U.S. Cl. .................. 330/207 P; 330/298
(58) Field of Classification Search ............. 330/207 P, 330/298, 149; 375/297; 455/114.3
See application file for complete search history.

(56) References Cited

U.S. PATENT DOCUMENTS

| 4,574,248 | A | * | 3/1986 | Snodgrass | 330/2 |
| 5,144,258 | A | * | 9/1992 | Nakanishi et al. | 330/129 |
| 5,589,683 | A | * | 12/1996 | Nakai | 250/214 R |
| 6,396,345 | B2 | * | 5/2002 | Dolman | 330/149 |
| 6,590,446 | B2 | * | 7/2003 | Nakamura | 330/51 |
| 7,030,800 | B2 | * | 4/2006 | Arai et al. | 341/155 |
| 7,327,191 | B2 | * | 2/2008 | Shako et al. | 330/149 |

FOREIGN PATENT DOCUMENTS

JP   2003-008360   1/2003

* cited by examiner

*Primary Examiner* — Henry Choe
(74) *Attorney, Agent, or Firm* — Murphy & King, P.C.

(57) ABSTRACT

An amplifier failure detection apparatus for a radio transmitter that has a function for compensating for amplifier distortion of the radio transmitter and a function for determining amplifier failure has occurred by detecting that the gain of an amplifier has dropped a set level or more, in which: a gain-detection unit detects the gain of the amplifier; an alarm-detection-level-generation unit, which has a table for storing alarm-detection levels that correspond to input-amplitude levels, generates an alarm-detection level that corresponds to an input-amplitude level; and a comparison unit compares the gain detected by the gain-detection unit with the alarm-detection level, and generates an alarm based on the comparison results.

7 Claims, 13 Drawing Sheets

AMPLIFIER FAILURE DETECTION APPARATUS

BACKGROUND OF THE INVENTION

This invention relates to an amplifier failure detection apparatus, and more particularly to an amplifier failure detection apparatus of a radio transmitter that comprises a function for correcting distortion of the amplifier of the radio transmitter, and detects the gain of the amplifier drops a set level or more in order to determine that amplifier failure has occurred.

Recently, high-performance transmission through digitization is often used in radio transmission. When multi value phase modulation is used in radio transmission, techniques for linearizing the amplification characteristics of a power amplifier, suppressing non-linear distortion, and reducing the power leakage to adjacent channels is particularly important; also when using an amplifier having poor linearity to improve power efficiency, it is essential that a technique be used to compensate for the resulting distortion.

FIG. 9 is a block diagram showing an example of a transmission apparatus in a conventional radio transmitter, where a transmission-signal-generation device 1 transmits a serial digital data sequence, and a serial-to-parallel converter (S/P converter) alternately divides the digital data sequence one bit at a time into two sequences, an In-phase component signal (I signal) and a Quadradture component signal (Q signal). A digital-to-analog converter 3 converts both the I signal and Q signal to analog baseband signals, and inputs them to a quadrature modulator 4. The quadrature modulator 4 multiplies the input I signal and Q signal (transmission baseband signals) by a reference carrier signal and a signal whose phase is shifted 90° from the reference carrier signal, respectively, and by adding the multiplication results, performs quadrature modulation and outputs the result. A frequency converter 5 performs frequency conversion by mixing the quadrature-modulated signal and a local oscillation signal, and a power amplifier (PA) 6 amplifies the power of the carrier signal that is output from the frequency converter 5 and that signal is then radiated into air from an aerial wire (antenna) 7.

In mobile communication such as W-CDMA, the transmission power of the transmission apparatus is a large 10 W to several 10 W, and the input/output characteristics (distortion function f(p)) of the power amplifier 6 becomes non-linear as shown by the dotted line in (a) of FIG. 10. Non-linear distortion occurs due to this non-linear characteristic, and in the frequency spectrum near the transmission frequency $f_0$, a side robe emerges as shown by the solid line in (b) of FIG. 10, thus power leaks to the adjacent channels causing adjacent interference. In other words, due to the non-linear distortion, the power of the transmission wave that leaks into the adjacent frequency channels becomes large as shown in (b) of FIG. 10. This power leakage becomes noise in other channels, which causes the quality of communication in those channels to become poor. Therefore, this is strictly regulated.

For example, the power leakage is small in the linear range of the power amplifier (see (a) of FIG. 10) and becomes large in the non-linear range. Therefore, so as to make the power amplifier a high-output amplifier, it is necessary that the linear range be increased. However, in order to increase the linear range, an amplifier having performance which is greater than that actually required becomes necessary, and thus there is a problem in that cost and size of the apparatus become a disadvantage. Therefore, a transmission apparatus having a distortion-compensation function that compensates for the distortion that causes the non-linearity of the power amplifier is used.

FIG. 11 is a block diagram showing a transmission apparatus having a digital-non-linear-distortion-compensation function that uses a Digital Signal Processor (DSP). A digital data group (transmission signal) that is transmitted from a transmission-signal-generation device 1 is converted to two sequences, an I signal and Q signal, by a S/P converter 2, and then input to a distortion-compensation unit 8 that comprises a DSP. The distortion-compensation unit 8 comprises: a distortion-compensation-coefficient-memory unit 8a that stores a distortion-compensation coefficient h(pi) that correspond to the power level pi (i=0 to 1023) of the transmission signal x(t); a predistortion unit 8b that performs distortion-compensation processing (predistortion) on the transmission signal; and a distortion-compensation-coefficient-calculation unit 8c that compares the transmission signal x(t) with the demodulated signal (feedback signal) that is demodulated by a quadrature demodulator that will be described later, then calculates and updates the distortion coefficient h(pi).

The distortion-compensation unit 8 performs predistortion processing on the transmission signal, after which it inputs the transmission signal to a DA converter 3. The DA converter 3 converts the input I signal and Q signal to analog baseband signals and inputs the results to a quadrature modulator 4. The quadrature modulator 4 performs quadrature modulation by multiplying the input I signal and Q signal by a reference carrier wave and a signal whose phase is shifted 90° from that reference carrier wave, respectively, then adding the multiplication results and outputting the results. A frequency converter 5 mixes the quadrature-modulated signal and a local oscillation signal and performs frequency conversion, after which a power amplifier 6 amplifies the power of the carrier-wave signal that is output from the frequency converter 5, and radiates that signal from an aerial wire (antenna) 7.

Part of the transmission signal is input to a frequency converter 10 via a directional coupler 9, where the frequency converter 10 down-converts the frequency and then inputs the signal to a quadrature-demodulator 11. The quadrature demodulator multiplies the input signal by both a reference-carrier wave and a signal whose phase is shifted 90° from that carrier wave, and performs quadrature demodulation to restore the I and Q baseband signals of the transmission side, and inputs the results to an AD converter 12. The AD converter 12 converts the input I and Q signals to digital signals and inputs them to a distortion-compensation unit 8. The distortion-compensation unit 8 performs adaptive signal processing that uses a LMS (Least Mean Square) algorithm to compare the transmission signal before distortion compensation with a feedback signal that was demodulated by the quadrature demodulator 11, and calculates and updates the distortion-compensation coefficient h(pi) so that the difference between the two signals becomes zero. After that, by repeating the operation described above, the non-linear distortion of the power amplifier 6 is suppressed, and the power leakage to adjacent channels is reduced.

FIG. 12 is a drawing showing the distortion-compensation process by adaptive LMS, and omits the modulation/demodulation unit, frequency conversion unit, etc. In FIG. 12, 15a is a multiplier (corresponds to the predistortion unit 8b in FIG. 11) that multiplies the transmission signal x(t) by a distortion-compensation coefficient $h_n(p)$, 15b is a DA converter that converts the distortion compensated signal to an analog signal, 6 is a power amplifier (PA) that has distortion characteristics represented by a distortion function f(p), 15d is a feedback system that feeds back the output signal y(t) from the power amplifier, 15e is an AD converter that converts the feedback signal to a digital signal, 15f is a power-calculation unit that calculates the power $p(=|x(t)|^2)$ of the transmission signal x(t) and outputs that power p as the read address of the distortion-compensation-coefficient-memory unit, 15g is a distortion-compensation-coefficient-memory unit (corresponds to the distortion-compensation-coefficient-memory unit 8a in FIG. 11) that stores a distortion-compensation coefficient that corresponds to the power of the transmission signal x(t), and together with outputting a distortion-compensation coefficient $h_n(p)$ that corresponds to the power p of the transmission signal x(t), updates the old distortion-compensation coefficient $h_n(p)$ with the distort ion-compensation coefficient $h_{n+1}(p)$ that is set according to the LMS algorithm.

Also, in FIG. 12, 15h is a distortion-compensation-coefficient-calculation unit that calculates a distortion-compensation coefficient $h_{n+1}(p)$ according to a LMS algorithm, 15i is a delay circuit for generating an address in the distortion-compensation-coefficient-memory unit 15g for writing the distortion-compensation coefficient $h_{n+1}(p)$, and this delay circuit 15i and the power-calculation unit 15f constitute an address-generation unit 15j. Moreover, 15k and 15m are delay circuits that adjust the timing of the transmission signal x(t) and feedback signal y(t), and control the delay time of each signal so that both the transmission signal x(t) and feedback signal y(t) are input simultaneously to the distortion-compensation-coefficient-calculation unit 21.

In the distortion-compensation-coefficient-calculation unit 15h, 21 is a subtractor that outputs the difference e(t) between the transmission signal x(t) before distortion compensation and the feedback signal y(t), 22 is an operational circuit that comprises: a multiplier 22a that multiplies the error e(t) by a step-size parameter μ; a complex-conjugate-signal-output unit 22b that outputs a complex-conjugate signal $y^{\ddagger}(t)$; a delay circuit 22c that adjusts the timing that the distortion-compensation coefficient $h_n(p)$ is output; a multiplier 22d that multiplies $h_n(p)$ and $y^{\ddagger}(t)$; a multiplier 22e that multiplies μe(t) and $u^{\ddagger}(t)$; and an adder 22f that adds the distortion-compensation coefficient $h_n(p)$ and μe(t) $u^{\ddagger}(t)$. With the construction described above, the calculation shown below is performed.

$$h_{n+1}(p)=h_n(p)+\mu e(t)u^{\ddagger}(t)$$

$$e(t)=x(t)-y(t)$$

$$y(t)=h_n(p)x(t)f(p)$$

$$u(t)=x(t)f(p)=h_n(p)^{\ddagger}y(t)$$

$$p=|x(t)|^2$$

Here, x, y, f, h, u and e are complex numbers, and ‡ is the complex conjugate. By performing the calculation above, the distortion-compensation coefficient h(p) is updated so that the difference signal e(t) between the transmission signal x(t) and feedback signal y(t) becomes a minimum, and finally, this converges to the optimum value of the distortion-compensation coefficient, and the distortion of the power amplifier 6 is compensated.

A radio transmitter having the distortion-compensation function described above is used in a base station apparatus in a mobile radio system. When a base station apparatus breaks down, it has a large effect on the users, so it is necessary that communication continues with no breaks, and in order to do this, countermeasures such as redundant construction of the power amplifier are being taken. In order to cope with that construction, it is necessary that amplifier failure be accurately and quickly detected, and then the amplifier be switched, or if necessary, to quickly notify the administrator of amplifier failure. In order to do this, the radio transmitter comprises a function for detecting that the gain of the power amplifier drops a set level or more, and thereby determining that failure of that power amplifier has occurred.

FIG. 13 is a drawing showing the construction of a transmission apparatus in a radio transmitter having an amplifier failure detection unit, where the same reference numbers are given to parts that are the same as those in FIG. 11 and FIG. 12. The quadrature modulator 4 and frequency converter 5 in FIG. 11 are shown as a modulator/frequency converter (MDFU) 31, and the frequency converter 10 and quadrature demodulator 11 in FIG. 11 are shown as a demodulator/frequency converter (DMFD) 32.

An amplifier failure detection unit 33 detects the gain of the power amplifier 6, and it comprises: a gain-detection unit 33a that outputs a voltage signal (gain-monitor voltage) Vout that corresponds to the gain; an alarm-threshold-value-generation unit 33b that generates a fixed alarm threshold level $V_{AL}$, and a comparator 33c that compares the gain that is detected by the gain-detection unit 33a and the alarm-threshold level, and generates an alarm based on the comparison results. The gain-detection unit 33a is built inside the power amplifier 6, however, in the drawing it is shown on the outside of the power amplifier 6.

FIG. 14 is a drawing showing the construction of the power amplifier 6 having a gain-detection function, and comprising: an amplifier 6a; a directional coupler 6b that extracts part of the input signal from the input side of the amplifier 6a; a directional coupler 6c that extracts part of the output signal from the output side of the amplifier 6a; an attenuator 6d; and a gain detector 33a that is created with a gain-detection IC circuit.

The gain-detection unit 33a comprises two log-amp detectors 33a-1, 33a-2 and a computation unit 33a-3, where the log-amp detectors 33a-1 and 33a-2 generate analog-voltage signals Va(Volt) and Vb(Volt) that correspond to the amplifier output signal and amplifier input signal, respectively, and inputs them to the computation unit 33a-3. The Va and Vb is represented by the following equations.

$$Va=10^{Pa/20}$$

$$Vb=10^{Pb/20} \quad (1)$$

Here, Pa and Pb are the powers (dB notation) that are input to the log-amp detectors 33a-1 and 33a-2.

The computation unit 33a-3 calculates the gain-detection voltage Vout(V) from the equation below.

$$\begin{aligned}Vout &= 1.2 \times \log(Va/Vb) + 0.9 \quad (2)\\ &= 1.2 \times \log(10^{Pa/20}/10^{Pb/20}) + 0.9 \\ &= 1.2 \times \{\log(10^{Pa/20}) - \log(10^{Pb/20})\} + 0.9 \\ &= 1.2 \times (Pa/20 - Pb/20) + 0.9 \\ &= 0.06 \times (Pa - Pb) + 0.9\end{aligned}$$

From Equation (2), the power difference between the two, or in other words, the gain-monitor voltage Vout(V) that corresponds to the gain is output as shown in FIG. 15 with a slope of 0.06 V/dB, and becomes 0.9 V when the power difference is 0 dB. The attenuator 6d that is located between the directional coupler 6c and the gain-detection unit 33a on the output side is for making the input levels that are input to the two log-amp detectors 33a-1, 33a-2 the same at the rated output.

Assuming that there is power amplifier failure when the gain drops a set dB level or more (for example, 3 dB), the alarm-threshold-value-generation unit 33b outputs a voltage (=0.9−0.06×3=0.72 V) that corresponds to the gain at the point when the gain has dropped more than that set dB level as a fixed alarm threshold voltage $V_{AL}$ (see FIG. 15). Also, during operation, the alarm-threshold-value-generation unit 33b compares the gain-monitor voltage $V_{out}$ that is calculated from Equation (2) with the alarm-threshold voltage $V_{AL}$, and when the gain-monitor voltage becomes less than the alarm-threshold voltage, it determines that the power amplifier 6 has failed and outputs a gain-fluctuation alarm.

FIG. 16 shows the input amplitude level vs. gain characteristics (AM-AM characteristics) 101 and the gain-monitor voltage characteristics 102 of the power amplifier as described above, and also shows the alarm-threshold voltage $V_{AL}$. As can be clearly seen from the input amplitude level vs. gain characteristics 101, the gain of the power amplifier 6 becomes a constant 50 dB for a reference input (−10 dBm) or less, and the gain-monitor voltage Vout is adjusted so that it becomes a constant 0.9 V. In the operating range, when the alarm-threshold voltage $V_{AL}$ is set at 0.72 V so that an alarm will be output when the gain drops from the normal gain (=50 dB) by 3 dB or more.

As described above, in FIG. 16 the gain is nearly constant in the operating range even though the input-amplitude level may vary, and the gain-monitor voltage Vout is also constant. On the other hand, as shown in FIG. 17, in recent power amplifiers 6 there is a trend for the gain to change according to the input-amplitude level in order that the amount of power consumption may be lowered. In other words, as the input-amplitude level becomes lower, there is a tendency for the gain of the power amplifier to become lower. When the gain changes in this way according to the input-amplitude level, the gain-monitor voltage Vout also changes as shown by the gain-monitor voltage characteristics 102.

Conventionally, since the gain was constant, there was no problem even though the threshold value of the gain-fluctuation alarm was set to a constant value, however, in the case of a power amplifier whose gain is not constant, even though the amplifier may be operating properly, there is a problem in that the gain-monitor voltage Vout drops as shown in FIG. 17 and becomes lower than the threshold value $V_{AL}$ of the gain-fluctuation alarm, and thus an alarm is output by mistake. In the example shown in FIG. 17, as the input level becomes low, the gain-monitor voltage Vout approaches the alarm-threshold voltage $V_{AL}$, and when the input-amplitude level is near −35 dBm, an alarm will be generated by mistake.

Furthermore, in a power amplifier whose gain is not constant the gain-monitor voltage fluctuates according to the following two cases. In other words the gain-monitor voltage fluctuates:

(1) when the input-amplitude level vs. gain characteristics differ for each individual power amplifier, for example when there are variations in the gain slope SL (see FIG. 17); and (2) when the gain changes due to changes in the operating environment such as temperature or power supply.

Therefore, in these cases, when the alarm-threshold voltage $V_{AL}$ that follows the fluctuation in the gain-monitor voltage is not set, there is a problem in that it is not possible to correctly detect amplifier failure.

There is prior art (JP2003-8360A) that detects an error state in a feedback loop based on changes of the distortion-compensation coefficient of the power amplifier per unit time, and controls the output power of the power amplifier according to an alarm signal when an error is detected. However, this prior art does not detect failure of the power amplifier. When there are changes in the gain characteristics with respect to the input-amplitude level, there is no prior art that accurately detects failure of a power amplifier.

SUMMARY OF THE INVENTION

Taking into consideration the aforementioned problems, it is the object of the present invention to accurately detect failure of a power amplifier even when the gain of the amplifier changes in accordance with the input-amplitude level.

Another object of the present invention is to accurately detect failure of a power amplifier even when the input-amplitude vs. gain characteristics differ for each individual power amplifier, and even when the gain changes due to changes in operating environment such as changes in temperature or power supply.

Also, another object of the present invention is to make it possible to easily determine that failure of a power amplifier has occurred by creating a table of alarm-threshold voltages $V_{AL}$ that correspond to input-amplitude levels.

Moreover, another object of the present invention is to make it possible to create and update the aforementioned table by using distortion-compensation coefficients of a distortion-compensation-control apparatus.

Furthermore, another object of the present invention is to accurately detect the failure of a power amplifier using simple construction by dividing the range of input-amplitude levels into a plurality of divisions, and creating a table that discretely stores alarm-detection levels that correspond to each division as fixed values.

This invention is an amplifier failure detection apparatus for a radio transmitter that has a function for compensating for amplifier distortion of the radio transmitter, and a function for determining amplifier failure has occurred by detecting that the gain of an amplifier has dropped a set level or more, and comprises: a gain-detection unit that detects the gain of the amplifier; an alarm-detection-level-generation unit that generates an alarm-detection level that corresponds to the input-amplitude level of the amplifier; and a comparison unit that compares the gain detected by the gain-detection unit with the alarm-detection level, and generates an alarm based on the comparison results.

The alarm-detection-level-generation unit comprises a table that stores alarm-detection levels that correspond to the input-amplitude levels, and references that table to generate an alarm-detection level that corresponds to the input-amplitude level.

The alarm-detection-level-generation unit divides the range of input-amplitude levels into a plurality of divisions, then creates a table so that the alarm-detection level for each division is fixed, and references that table to generate an alarm-detection level that corresponds to the input-amplitude level.

The amplifier failure detection apparatus further comprises a table-creation unit that creates the aforementioned table, taking into consideration the gain characteristics with respect to the input-amplitude level of the amplifier when the amplifier is in a normal state.

A distortion-compensation-control unit that performs the distortion-compensation function of the amplifier comprises: a distortion-compensation-coefficient-memory unit that stores a distortion-compensation coefficient for the input-amplitude level; a distortion-compensation unit that uses that distortion-compensation coefficient that corresponds to the input-amplitude level to compensate for the distortion of the amplifier; and a coefficient update unit that updates the distortion-compensation coefficient that is stored in the distortion-compensation-coefficient-memory unit; and where the table-creation unit uses the distortion-compensation coefficient stored in the distortion-compensation-coefficient-memory unit to create the table.

Moreover, the table-creation unit uses a distortion-compensation coefficient created during distortion training to create the table, and uses the updated distortion-compensation coefficient to update the table.

According to this invention, an alarm-detection level that changes in accordance to the input-amplitude level of the amplifier is generated, the detected gain of the amplifier is compared with that alarm-detection level, and an alarm is generated based on the comparison result, so it is possible to accurately detect that failure of the power amplifier has occurred even when the gain of the amplifier changes in accordance to the input-amplitude level.

Also, according to this invention, the alarm-detection level is generated taking into consideration the gain characteristics with respect to the input-amplitude level of the amplifier in the normal state for each individual power amplifier, so it is possible to accurately detect that failure of an amplifier has occurred even when the input-amplitude level vs. gain characteristics differ for each power amplifier, and even though the operating conditions may change such as changes in the temperature and power supply.

Moreover, according to this invention, by storing alarm-threshold voltages $V_{AL}$ that correspond to input-amplitude levels in a table, it is possible to easily determine that failure of a power amplifier has occurred.

Furthermore, according to this invention, the range of input-amplitude levels is divided into a plurality of division, and the alarm-threshold voltage $V_{AL}$ for each division is a fixed value, so there is no need for a complex table. Also, by dividing the range of input-amplitude levels into a plurality of divisions, making the alarm-threshold value $V_{AL}$ for each division a fixed value, and creating a table that specifies the alarm-threshold voltage $V_{AL}$ that corresponds to each division, it is possible to accurately detect failure of a power amplifier by simple construction.

Also, according to this invention, the aforementioned table is created using a distortion-compensation coefficient for each individual power amplifier, so it is possible to accurately detect failure of a power amplifier even when the gain of the amplifier changes in accordance to the input-amplitude level, or even when the input-amplitude level vs. gain characteristics differ for each power amplifier, or even though the operating conditions may change, such as a change in temperature or power supply. Also, the aforementioned table is updated using updated distortion-compensation coefficients, so it is possible to detect failure of a power amplifier based on the most recent input-amplitude level vs. gain characteristics.

Other features and advantages of the present invention will be apparent from the following description taken in conjunction with the accompanying drawings.

DESCRIPTION OF THE PREFERRED EMBODIMENTS (A) Embodiment 1

Figure 1:
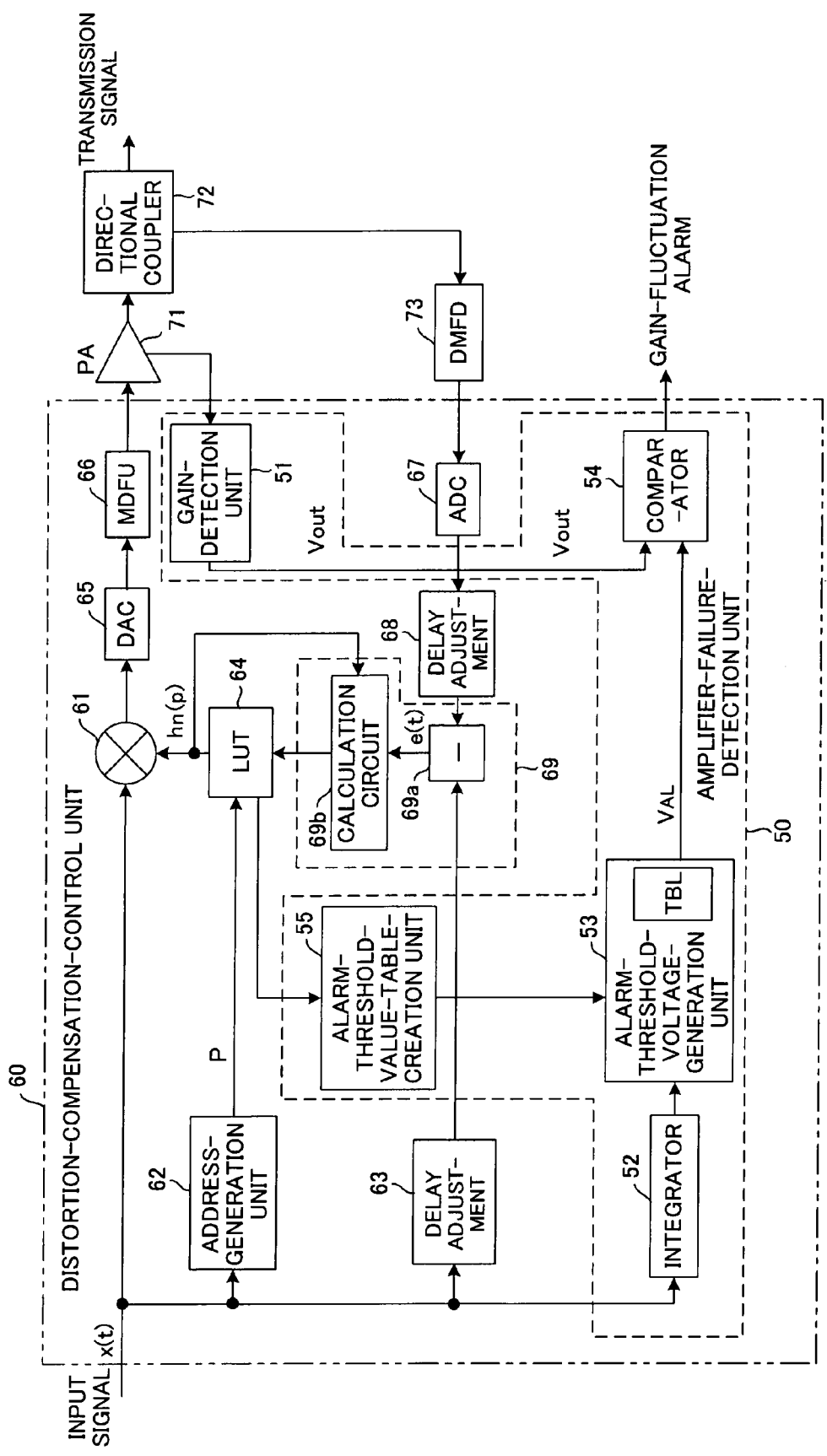
FIG. 1 is a drawing showing the construction of a transmission apparatus in the radio transmitter of this invention.

FIG. 1 is a drawing showing the construction of a transmission apparatus in the radio transmitter of the present invention. Except for an amplifier failure detection unit 50, this transmission apparatus comprises the same functions as a prior transmission apparatus with a power amplifier distortion compensation function.

A transmission signal x(t) is respectively input to a predistortion unit 61, address-generation unit 62 and delay unit 63 of a distortion-compensation-control unit 60. The address-generation unit 62 computes the power p $(=|x(t)|^2)$ of the transmission signal x(t) and outputs that power p as a read address in the distortion-compensation-coefficient-memory unit (look-up table LUT) 64, then the look-up table LUT 64 reads the distortion-compensation coefficient $h_n(p)$ from that address and inputs it to the predistortion unit 61. The predistortion unit 61 multiplies the transmission signal x(t) by the distortion-compensation coefficient $h_n(p)$, then a DA converter 65 converts the multiplication result to analog, and a quadrature modulator/frequency converter (MDFU) 66 performs quadrature modulation of the input signal, after which it converts the frequency of the quadrature-modulated signal from a baseband frequency to a radio frequency and inputs the result to a power amplifier (PA) 71. The power amplifier 71 amplifies the input signal and transmits the signal from an antenna (not shown in the figure) via a directional coupler 72. The directional coupler 72 extracts part of the transmission signal and inputs it to a quadrature demodulator/frequency converter (DMFU) 73. The quadrature demodulator/frequency converter 73 converts the frequency of the signal from a radio frequency to a baseband frequency, and then performs quadrature demodulation to restore the transmission signal and inputs it to an AD converter 67.

The AD converter 67 converts the input signal to digital, then inputs the signal to a distortion-compensation unit 69 via a delay-adjustment unit 68. The transmission signal is also input to the distortion-compensation unit 69 from the delay-adjustment unit 63. The delay-adjustment unit 63 and the delay-adjustment unit 68 perform delay control so that the transmission signal and the feedback signal are input to the distortion-compensation unit 69 at the same time.

The distortion-compensation unit 69 compares the transmission signal before distortion compensation with the feedback signal using adaptive signal processing that uses a LMS (Least Mean Square) algorithm, and calculates and updates the distortion-compensation coefficient so that the difference between the two signals becomes zero. In other words, a subtractor 69a outputs the difference e(t) between the transmission signal x(t) before distortion compensation and the feedback signal y(t), and a calculation circuit 69b calculates a distortion-compensation coefficient so that the difference becomes zero, and updates the distortion-compensation coefficient in the look-up table LUT 64. After that, the operation described above is repeated, and together with compensating for the distortion of the power amplifier 71, a distortion-compensation coefficient corresponding to the amplitude of each transmission signal is stored in the look-up table LUT 64.

Figure 2:
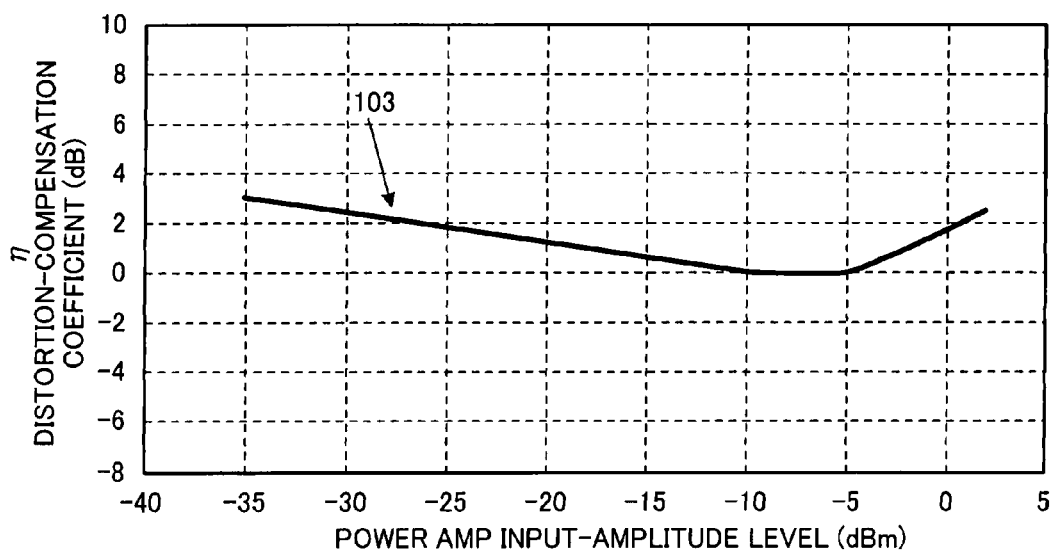
FIG. 2 shows the distortion-compensation coefficient with respect to the input-amplitude of a look-up table LUT when distortion compensation is operating properly.
Figure 17:
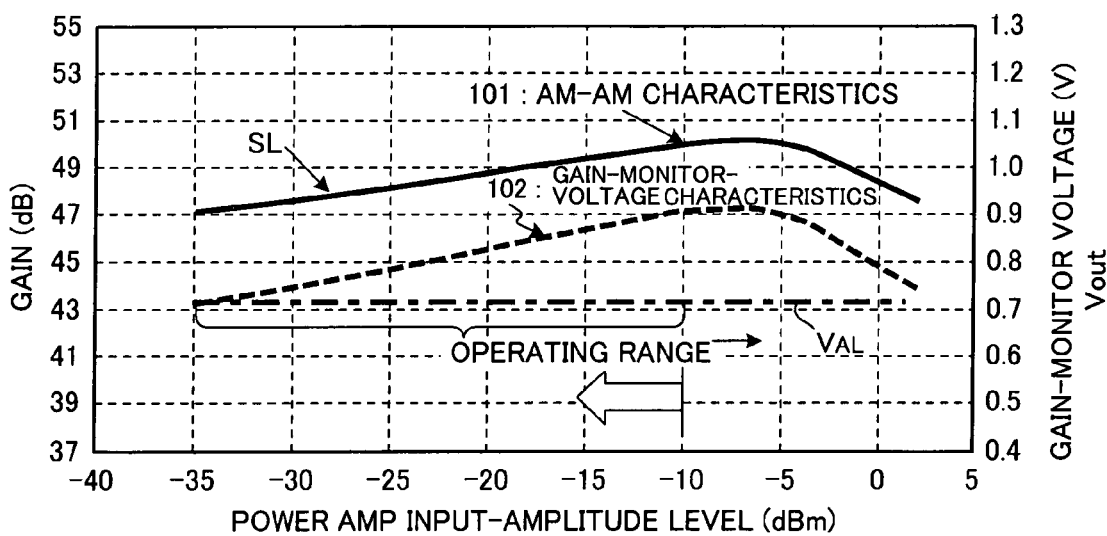
FIG. 17 is a drawing explaining the input-amplitude level versus the gain characteristics and gain-monitor-voltage characteristics of a power amplifier in the case where the gain changes according to the input-amplitude level.

FIG. 2 shows the distortion-compensation coefficient 103 with respect to the input-amplitude level in the look-up table LUT 64 when distortion is operating properly. The distortion-compensation operation compensates for changes in the input-amplitude level vs. gain characteristics 101 of the power amplifier 7 (see FIG. 17), so inevitably, the input-amplitude level vs. distortion-compensation coefficient characteristics 103 are opposite to the input-amplitude level vs. gain characteristics 101 of the power amplifier 71. The distortion-compensation coefficient η is shown using dB in FIG. 2. At the reference input (−10 dBm), the distortion-compensation coefficient η is 1(0 dB), and it becomes larger as the input-amplitude level becomes smaller. The result obtained multiplying the transmission signal x by the distortion-compensation coefficient η is given in dB as $$20 \log(\eta \times x) = 20 \log \eta + 20 \log x$$

where the first term on the right side is the distortion-compensation coefficient expressed in dB, and the second term on the right is the input-amplitude level (dBm).

The distortion-compensation function of the distortion-compensation-control unit 60 was described above. Next, the detection of amplifier failure by this invention will be explained.

Figure 14:
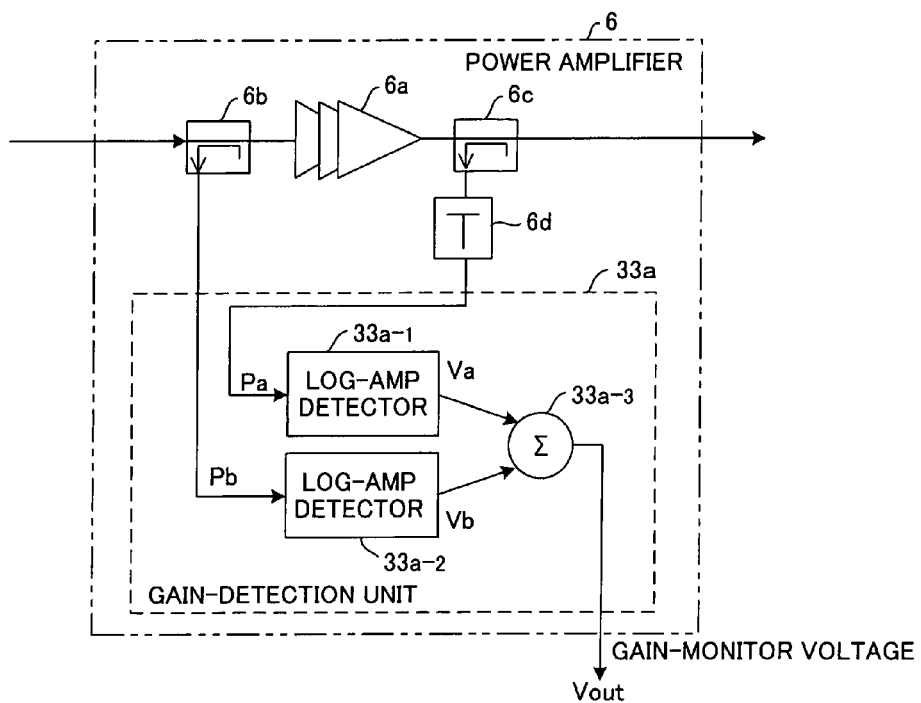
FIG. 14 is a drawing showing the construction of a power amplifier having a gain-detection function.
Figure 15:
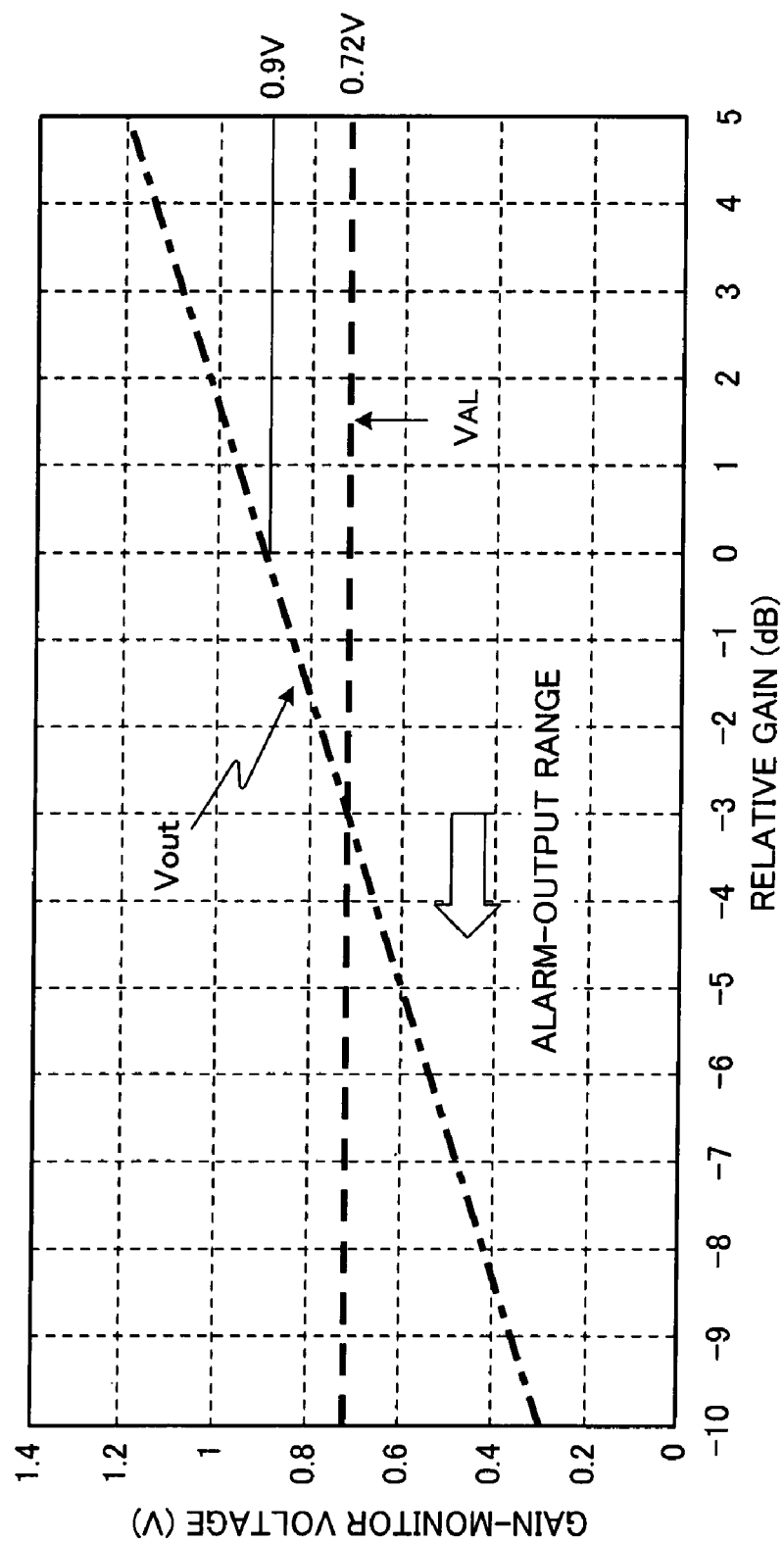
FIG. 15 shows the gain-monitor voltage that corresponds to the gain.
Figure 16:
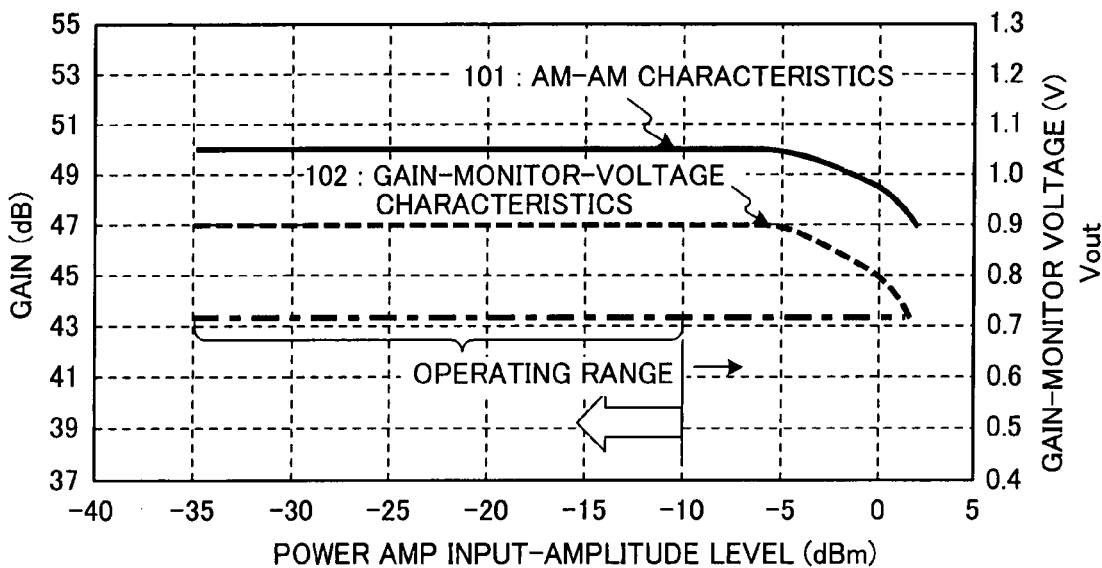
FIG. 16 is a drawing explaining input-amplitude level versus the gain characteristics and gain-monitor-voltage characteristics of a power amplifier in the case where the gain is constant according to the input-amplitude level.

In the amplifier failure detection unit 50, a gain-detection unit 51 detects the gain of the power amplifier 71 by a conventional method, and outputs a voltage signal (gain-monitor voltage) Vout that corresponds to that gain (see FIG. 14). An integrator averages the input signal over a fixed amount of time, then calculates and inputs the average input-amplitude level to an alarm-threshold-value-generation unit 53. The alarm-threshold-value-generation unit 53 generates an alarm-threshold voltage $V_{AL}$ that corresponds to the average input-amplitude level, and a comparator 54 compares the gain-monitor voltage $V_{out}$ that is detected by the gain-detection unit 51 with the alarm-threshold voltage $V_{AL}$, and based on the comparison results, or in other words, when $V_{out} < V_{AL}$, generates a gain-fluctuation alarm. The alarm-threshold-value-generation unit 53 comprises a table TBL that stores alarm-threshold voltages that correspond to input-amplitude levels, and it refers to that table to generate an alarm-threshold voltage $V_{AL}$ that corresponds to the input-amplitude level, and inputs that alarm-threshold voltage $V_{AL}$ to the comparator 54.

Figure 3:
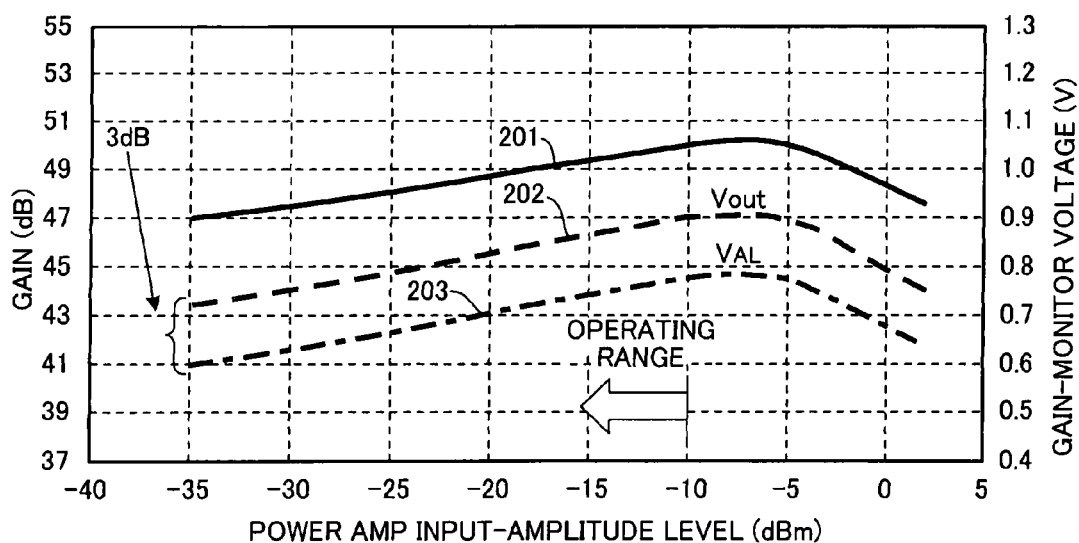
FIG. 3 shows the gain characteristics, gain-monitor-voltage characteristics and alarm-threshold-voltage characteristics that correspond to the input amplitude of the power amplifier.

An alarm-threshold-value-table-creation unit 55 creates the table TBL mentioned above using distortion-compensation coefficients for input-amplitude levels that are stored in the look-up table LUT 64, and sets it in the alarm-threshold-voltage-generation unit 53. As shown in FIG. 2, the input-amplitude level vs. distortion-compensation coefficient characteristics 103 are opposite to the input-amplitude level vs. gain characteristics (AM-AM characteristics) of the power amplifier, so the alarm-threshold-value-table-creation unit 55 calculates alarm-threshold voltages that have the opposite characteristics of the distortion-compensation coefficients, and creates the table TBL. FIG. 3 shows the gain characteristics (AM-AM characteristics) 201, gain-monitor-voltage characteristics 202 that correspond to the input-amplitude level of the power amplifier, and the alarm-threshold-voltage characteristics 203 that are created by the alarm-threshold-value-table-creation unit 54. As can be clearly seen from FIG. 3, the difference between the gain-monitor voltage $V_{out}$ and the alarm-threshold voltage $V_{AL}$ during normal operation, is a constant 3 dB.

When the power amplifier 71 has failed, the gain of the power amplifier quickly drops, and following it, the gain-monitor voltage $V_{out}$ also drops. However, since the LUT 64 does not converge immediately, the contents of the alarm-threshold-value table TBL are corrected after an appropriately long time delay. With this time delay it is possible to more accurately determine when an alarm should be generated.

Figure 4:
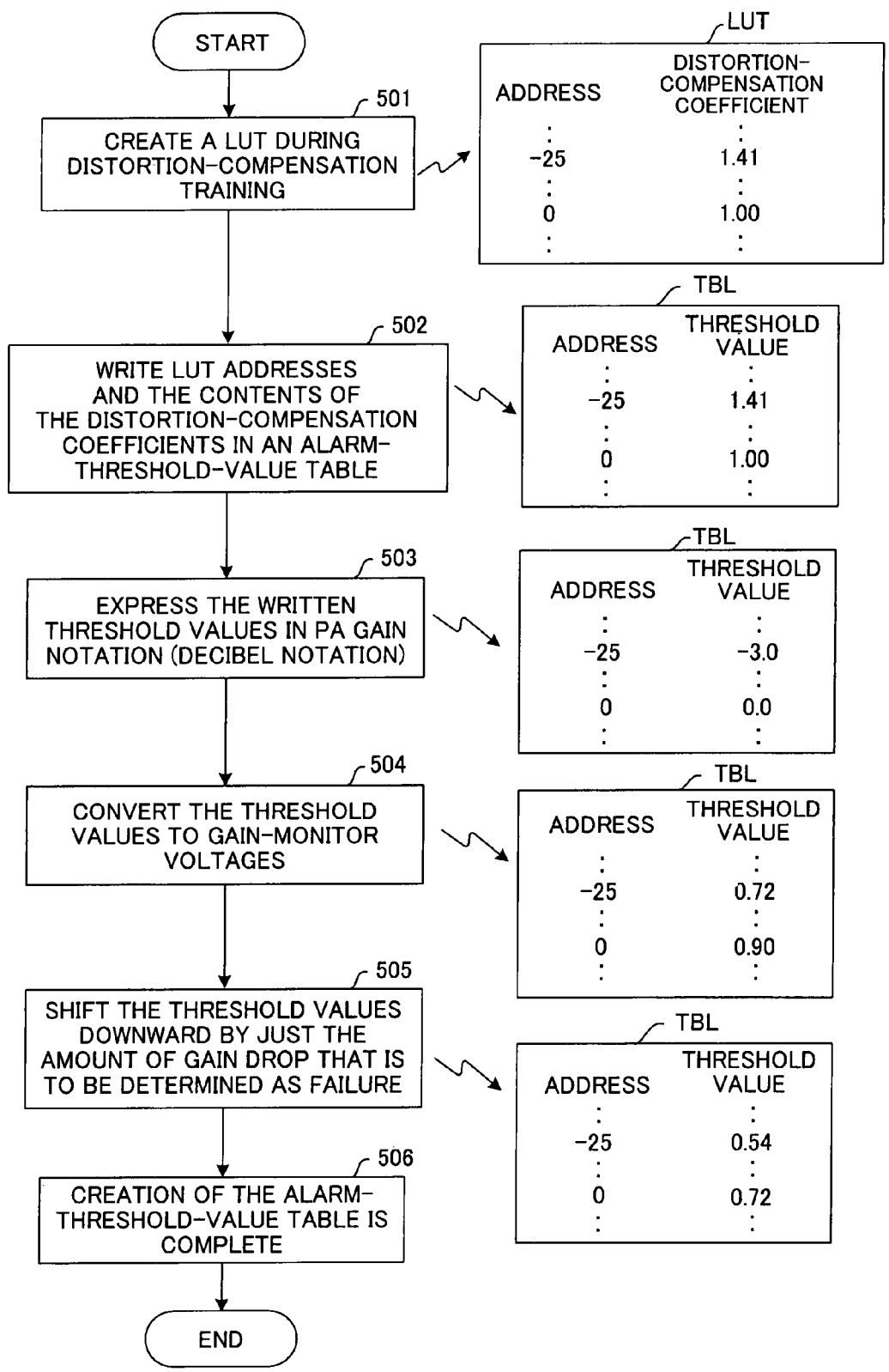
FIG. 4 is a flowchart showing the process for creating a table.

FIG. 4 is a flowchart of the processing by the alarm-threshold-value-creation unit 55 when creating the table TBL. First, in a manufacturing test, distortion-compensation training is performed, and initial values for the distortion-compensation coefficients are set in the look-up table LUT 64 (step 501). In this case, training is performed with a reference input of −10 dBm. Also, the LUT address for −10 dBm expressed using decibel notation becomes 0 dB, and the address of an input-amplitude level of −35 dBm becomes −35−(−10)=−25.

Also, the distortion-compensation coefficients in the LUT are expressed as the inverse of the voltage v that corresponds to the gain difference between the gain at the time when the input-amplitude level is −10 dBm (=50 dB) and the gain at the time when the input-amplitude level is other than −10 dBm. Here, the gain difference when the input-amplitude level is −10 dBm is 0 (dB), and v=1. In other words, the gain difference is 20 log v.

Therefore, when the gain at a level of −10 dBm is taken to be 50 dB, and the gain at a level of −35 dBm is taken to be 47 dB, the voltage v at a level of −35 dBm is found from the following equation $$(47-50) \text{ dB} = 20 \log v$$

and becomes $$v = 10^{(47-50)/20}.$$

From this, the distortion-compensation coefficient η is given by the following equation.

$$\eta = 1/10^{(47-50)/20} = 1.41 \tag{3}$$

Next, the distortion-compensation coefficient η that is found from Equation (3) is written in the LUT address when the level is −35 dBm. Similarly, distortion-compensation coefficients η that correspond to all of the input-amplitude levels are written.

After that, the alarm-threshold-value-table-creation unit 55 writes the LUT address and the contents of the distortion-compensation-coefficient in the alarm-threshold-value table TBL (step 502).

At this point, the threshold value becomes the distortion-compensation coefficient η. The distortion-compensation coefficient η is a value whose product multiplied by the gain of the power amplifier will result in '1', so the alarm-threshold-value-table-creation unit 55 finds the gain of the power amplifier at each input-amplitude level from the inverse of the distortion-compensation coefficient η, then calculates the logarithm for that gain, and expresses the threshold values of the alarm-threshold-value-table TBL in decibels (step 503). For example, it calculates the distortion-compensation coefficient in decibel notation from the distortion-compensation coefficient η at address '−25' using the following equation.

$$20 \log(1/1.41) = -3.0 \text{ (dB)}$$

Next, the alarm-threshold-value-table-creation unit 55 converts the threshold value (dB) to a gain-monitor voltage (V) and rewrites the alarm-threshold-value table TBL (step 504).

For example, the alarm-threshold-value-table-creation unit 55 finds the threshold value (V) from the rate of change of the gain-monitor voltage (=0.06 V/dB) and the reference gain-monitor voltage (=0.9 V) and using the following equation.

$$0.06 \times \text{Threshold value (dB)} + 0.9 \rightarrow \text{Threshold value (V)}$$

From this, the threshold value (dB) for address −25 becomes $$0.06 \times (-3.0) + 0.9 \rightarrow 0.72$$

and the threshold value (dB) for address 0 becomes $$0.06 \times (0.0) + 0.9 \rightarrow 0.9.$$

From this step 504, the normal gain-monitor-voltage characteristics 202 shown in FIG. 3 are stored in the alarm-threshold-value table TBL.

After that, the alarm-threshold-voltage characteristics 203 are obtained by shifting downward the gain-monitor-voltage characteristics 202 by just the amount of gain drop (for example 3 dB) that is to be determined as failure (step 505), after which creation of the alarm-threshold table is completed (step 506).

When it is desired to output an alarm at a gain drop of α dB, the alarm-threshold voltage $V_{AL}$ is calculated from the following equation using the gain-monitor voltage Vout and rate of change of gain-monitor voltage 0.06.

$$V_{AL} = 0.06 \times \alpha + V\text{out}$$

For example, when an alarm is to be output at a gain drop of 3 dB, the alarm-threshold voltage $V_{AL}$ at address −25 becomes $$V_{AL} = 0.06 \times (-3) + 0.72 = 0.54$$

And the alarm-threshold voltage $V_{AL}$ at address 0 becomes $$V_{AL} = 0.06 \times (-3) + 0.9 = 0.72.$$

The table creation process described above is performed periodically at a specified period, and the table TBL is updated based on the latest power amplifier characteristics.

According to the first embodiment described above, an alarm-detection level is generated that changes according to the input-amplitude level of the amplifier, the detected gain is then compared with that alarm-detection level, and an alarm is generated based on the results of that comparison, so even when the gain changes in accordance with the input-amplitude level, it is possible to accurately detect failure of the power amplifier.

Moreover, according to this first embodiment, the alarm-detection level is generated taking into consideration the characteristics of the gain with respect to the input-amplitude level of the amplifier in each normal state for each individual power amplifier, so even when the input-amplitude level vs. gain characteristics for each power amplifier differ, it is possible to accurately detect failure of the power amplifier.

Furthermore, according to this first embodiment, it is possible to easily determine that there is failure of the power amplifier by creating a table of alarm-threshold voltages $V_{AL}$ that correspond to the input-amplitude level.

Also, according to this first embodiment, the aforementioned table is created using distortion-compensation coefficients for each individual power amplifier, so even when the gain changes in accordance with the input-amplitude level, or even when the input-amplitude level vs. gain characteristics differ for each power amplifier, or even though the gain may change due to changes in the operating environment such as changes in temperature or power supply, it is possible to accurately detect failure of the power amplifier. Moreover, since the aforementioned table is updated using updated distortion-compensation coefficients, it is possible to detect failure of a power amplifier based on the latest input-amplitude level vs. gain characteristics.

(B) Embodiment 2

Figure 5:
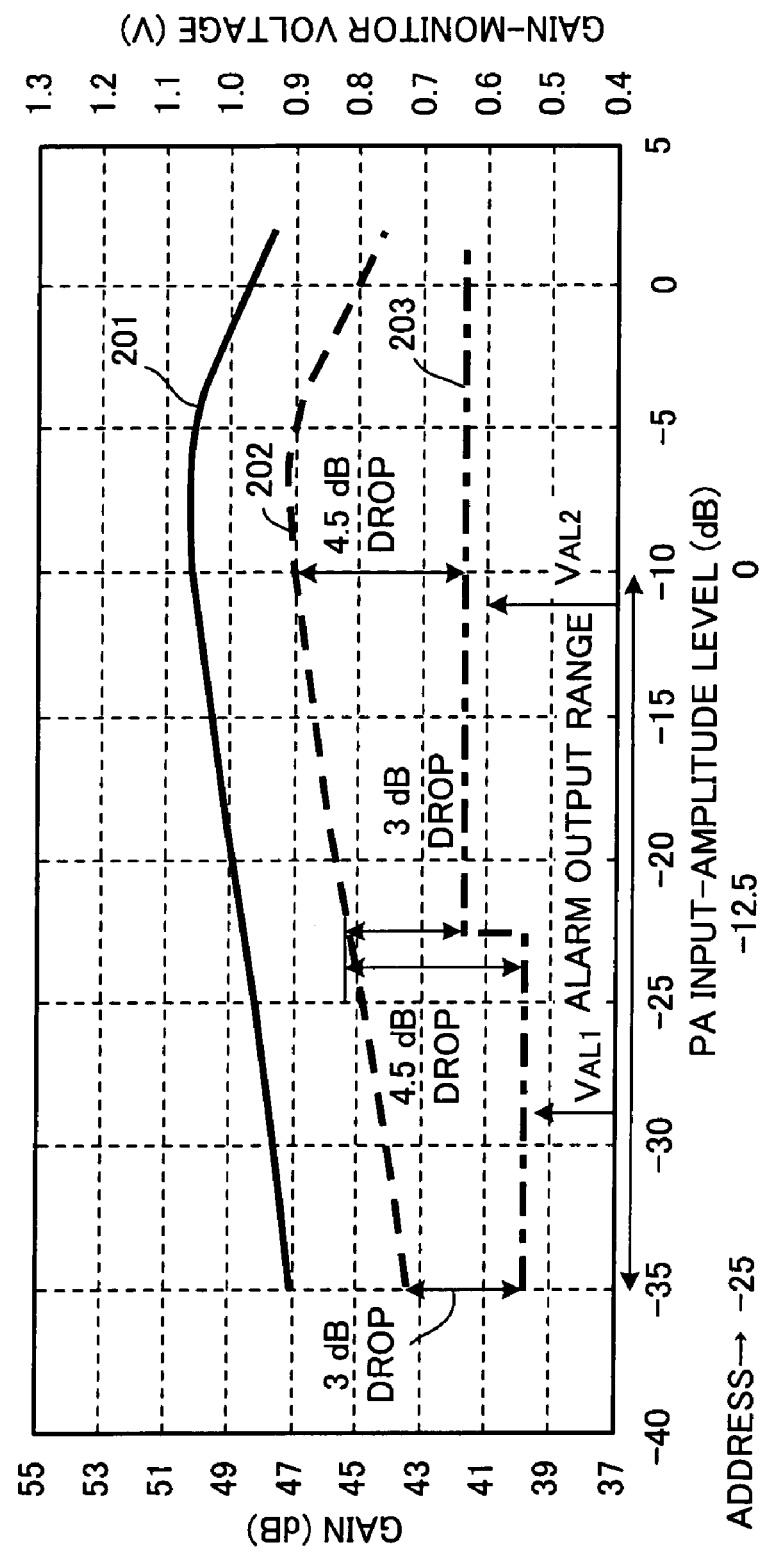
FIG. 5 is a drawing explaining a second embodiment.

FIG. 5 is a drawing explaining a second embodiment of the present invention. In the first embodiment, an alarm-threshold voltage that corresponded to the input-amplitude level was calculated based on the input-amplitude level vs. gain characteristics 201 (see FIG. 3) of the power amplifier and saved in a table TBL. In other words, in the first embodiment, the alarm-threshold voltage characteristics 203 that are shown in FIG. 3 were saved in a table TBL. However, in this second embodiment, as shown in FIG. 5, the range of the input-amplitude level in which an alarm is output is divided into a plurality of divisions (two divisions in the figure), and alarm-detection levels $V_{AL1}$, $V_{AL2}$ for each division correspond to a respective input-amplitude level and are stored sequentially in a table TBL, and an alarm-threshold voltage is generated that corresponds to the respective input-amplitude level.

The transmission apparatus in the radio transmitter of this second embodiment is not shown in the figure, however it has the same construction as the transmission apparatus of the first embodiment. It differs in that the alarm-threshold-value-table-creation unit 55 creates a table of the alarm-threshold-voltage characteristics 203 shown in FIG. 5 and sets that table in the alarm-threshold-voltage-generation unit 53.

Figure 6:
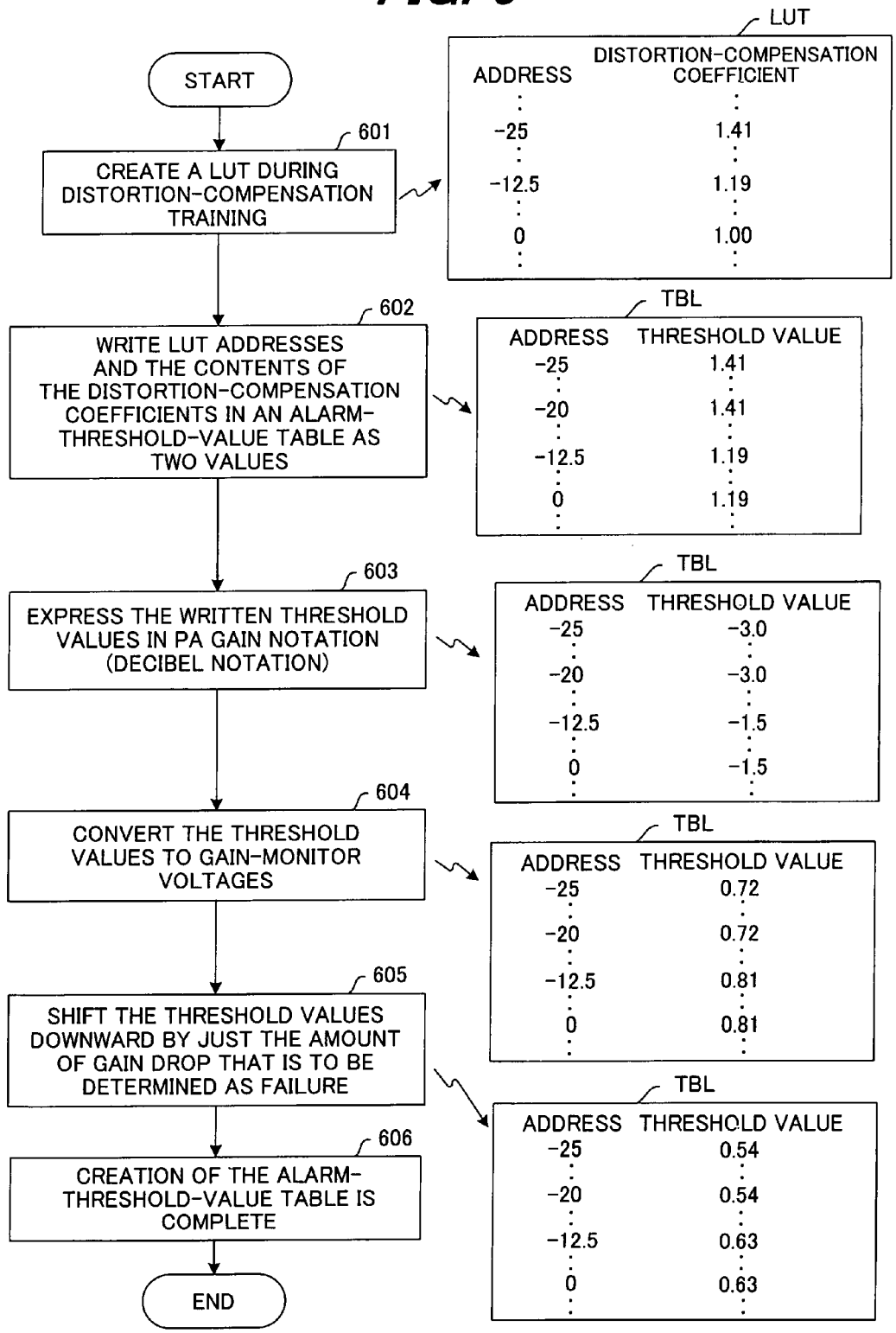
FIG. 6 is a flowchart showing the process for creating a table in a second embodiment.

FIG. 6 is a flowchart of the process performed by the alarm-threshold-value-table-creation unit 55 for creating a table TBL, and it divides the range of input-amplitude levels into two divisions with an input-amplitude level of −22.5 (dBm) as the border between each division and writes the alarm-threshold voltage for each respective range in a table TBL. The processing performed in the steps 601 to 606 is nearly the same as the processing performed in the steps 501 to 506 shown in FIG. 4.

First, in a manufacturing test, distortion compensation training is performed and initial values for the distortion-compensation coefficients are set in a look-up table LUT 64 (step 601). In this case, training is performed at a reference input of −10 dBm. Also, the address in the LUT for −10 dBm is stored in decibel notation as 0 dB, the address for an input-amplitude level of −35 dBm becomes −35−(−10)=−25, and the address for an input-amplitude level of −22.5 dBm becomes −22.5−(−10)=−12.5.

Next, the alarm-threshold-value-table-creation unit 55 writes the distortion-compensation coefficient (=1.41) for the LUT address −25 in the alarm-threshold-value table TBL as the distortion-compensation coefficient for addresses less than −12.5, and writes the distortion-compensation coefficient (=1.19) for address −12.5 in the alarm-threshold-value table TBL as the distortion-compensation coefficient for addresses greater than address −12.5 (step 602).

At this point, the threshold value is the distortion-compensation coefficient $\eta$. The distortion-compensation coefficient $\eta$ is a value whose product multiplied by the gain of the power amplifier is '1', so the alarm-threshold-value-table-creation unit 55 finds the gain of the power amplifier at each input-amplitude level from the inverse of the distortion-compensation coefficient $\eta$, then calculates the logarithm for the gain, and stores the threshold values of the alarm-threshold-value table in decibel notation (step 603). For example, the distortion-compensation coefficient in decibel notation is calculated from the distortion-compensation coefficient $\eta$ of address −25 using the equation $$20 \log(1/1.41) = -3.0 \text{ (dB)}$$

and the distortion-compensation coefficient in decibel notation is calculated from the distortion-compensation coefficient $\eta$ of address −12.5 using the equation $$20 \log(1/1.19) = -1.5 \text{ (dB)}.$$

Next, the alarm-threshold-value-table-creation unit 55 converts the threshold values (dB) to gain-monitor voltages (V), and rewrites the alarm-threshold-value table TBL (step 604).

For example, from the rate of change (=0.06 V/dB) of the gain-monitor voltage and a reference gain-monitor voltage (=0.9 V), the threshold value (dB) at address −25 is found from the following equation.

$$0.06 \times (-3.0) + 0.9 \to 0.72,$$

and the threshold value (dB) at address −12.5 becomes $$0.06 \times (-1.5) + 0.9 \to 0.81.$$

After that, the alarm-threshold-voltage characteristics 203 shown in FIG. 5 are obtained by shifting downward by just the amount of gain drop (for example 3 dB) that is to be determined as failure (step 605), and creation of the alarm-threshold-value table is complete (step 606).

FIG. 5 shows the case in which the boundary is center between the reference input (−10 dBm) and the lower-limit value (−30 dBm), and as can be clearly seen from this figure, in this second embodiment, the amount of gain drop at which it is determined that the power amplifier has failed according to the input-amplitude level changes in the range from 3 dB to 4.5 dB, and alarm detection error increases a little.

According to this second embodiment, it is possible to obtain the almost same effects as in the first embodiment. Also, according to this second embodiment, the alarm detection error increases a little, however, it has an advantage in that there is no need for a complicated table.

Variation

As shown in FIG. 5, in the second embodiment, the range of input-amplitude levels is divided into a plurality of divisions (two divisions in the figure), and an alarm-detection level $V_{AL1}$, $V_{AL2}$ for each division is correlated with a respective input-amplitude level and stored sequentially in a table TBL, then alarm-threshold voltages are generated that correspond to the input-amplitude levels. However, it is also possible to store alarm-detection levels $V_{AL1}$, $V_{AL2}$ that correspond to respective divisions in a table, and to generate an alarm-detection level based on the division to which the input-amplitude level belongs.

Figure 7:
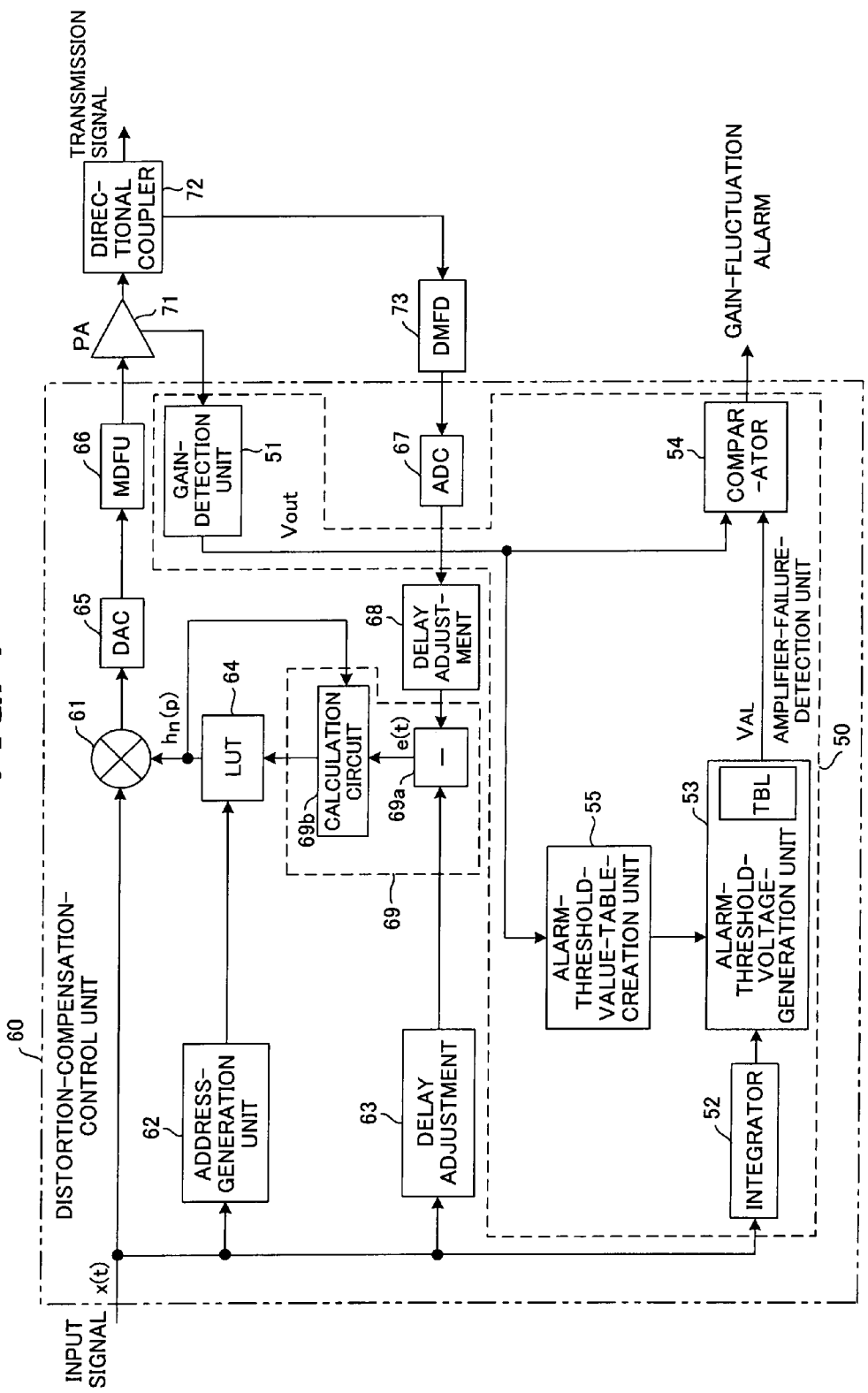
FIG. 7 is a drawing showing a variation of the construction of a transmission apparatus.

FIG. 7 shows a variation of the construction of a transmission apparatus, where the same reference numbers are given to parts that are the same as those of the transmission apparatus in the first embodiment shown in FIG. 1. This construction differs in that the alarm-threshold-value-table-creation unit 55 does not use the distortion-compensation coefficients of the LUT 64, but rather finds the alarm-detection levels $V_{AL1}$, $V_{AL2}$ that correspond to the respective divisions from the gain-monitor voltage Vout, and then creates a table TBL.

Figure 8:
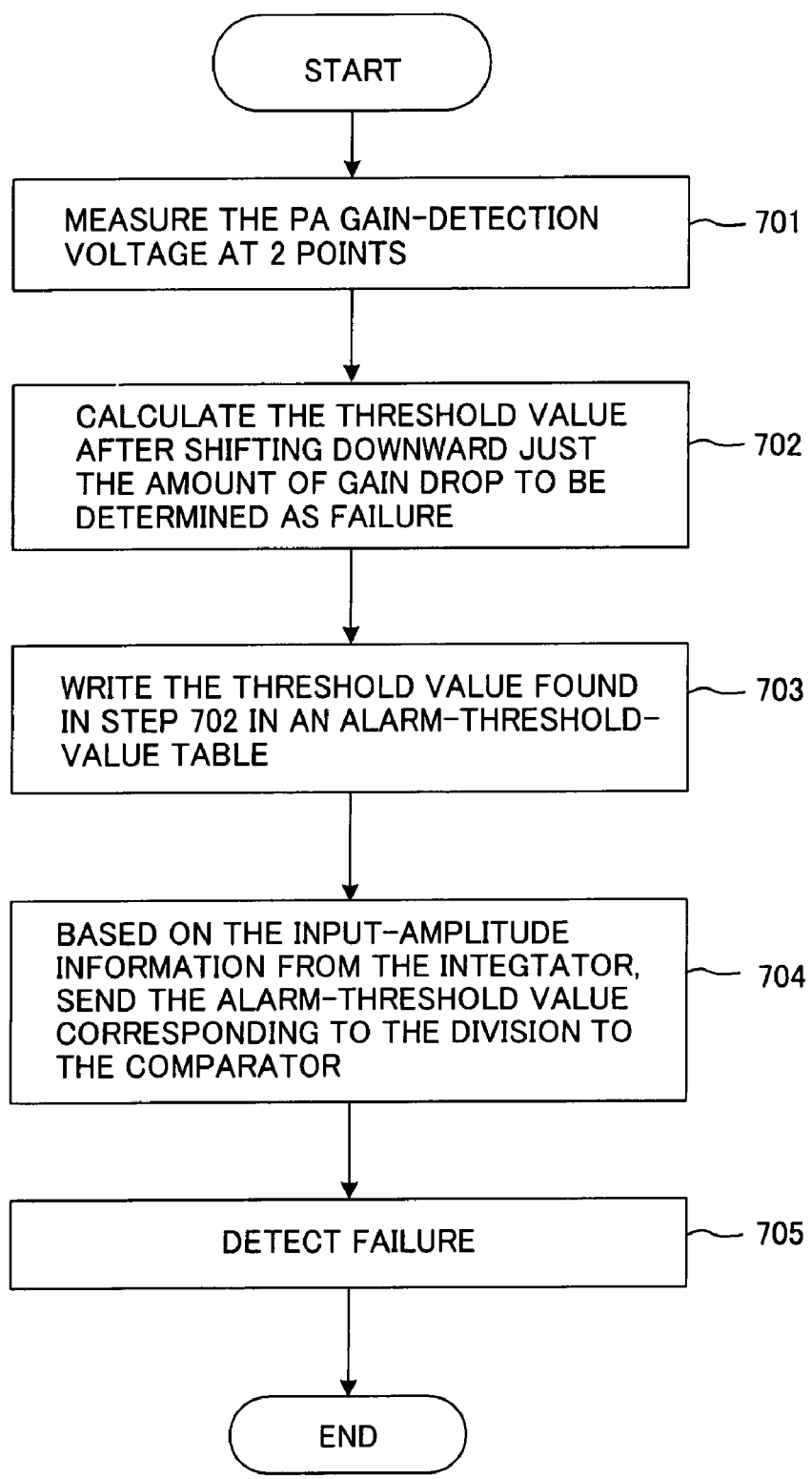
FIG. 8 is a flowchart showing a variation of the process for creating a table and detecting failure.
Figure 9:
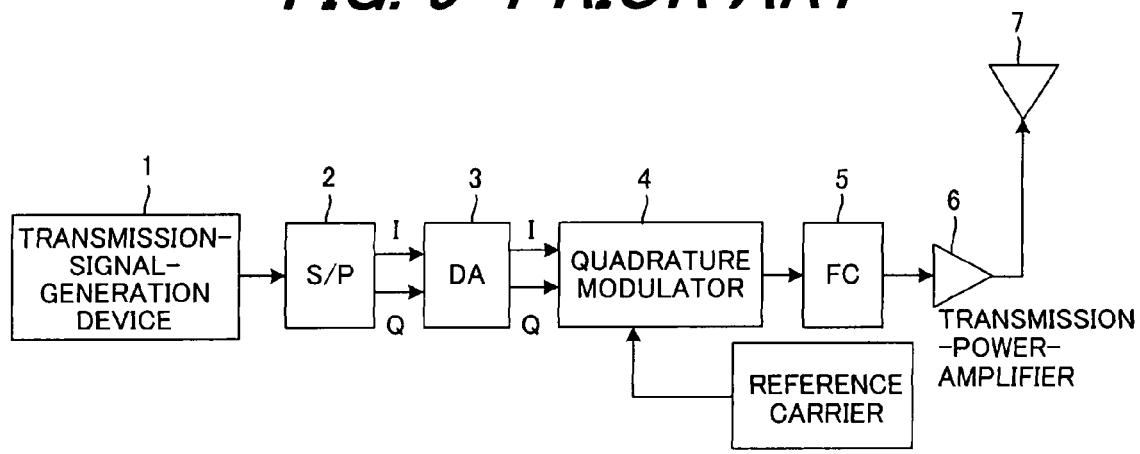
FIG. 9 is a block diagram showing an example of a transmission apparatus in a prior radio transmitter.
Figure 10:
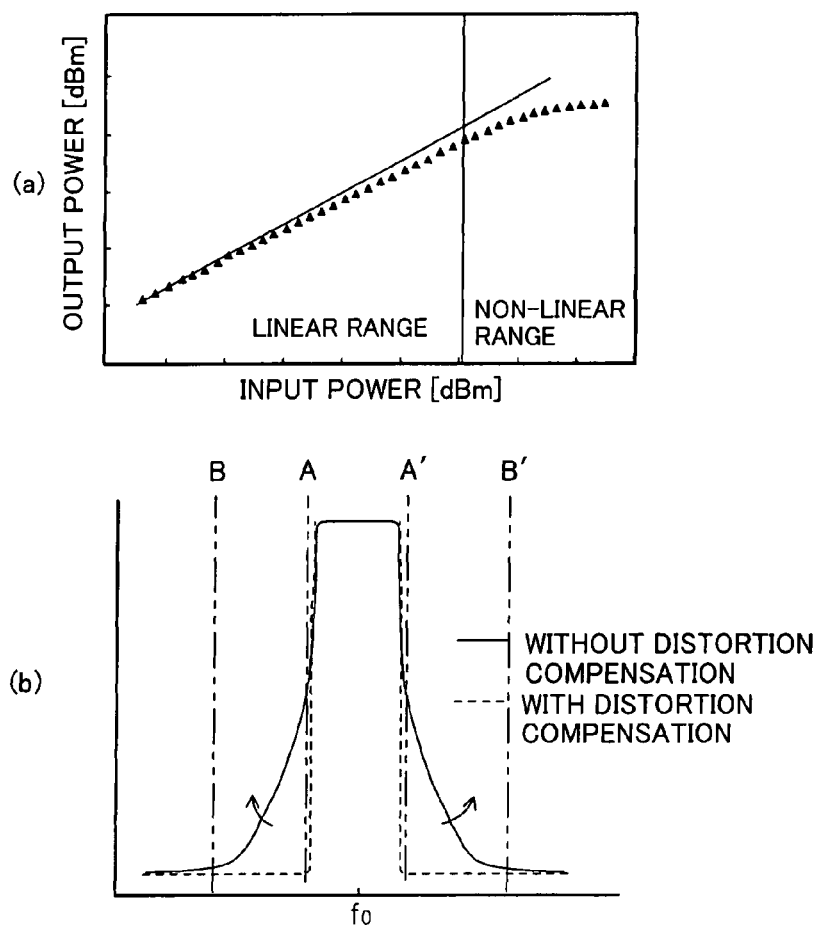
FIG. 10 shows the input/output characteristics of a power amplifier.
Figure 11:
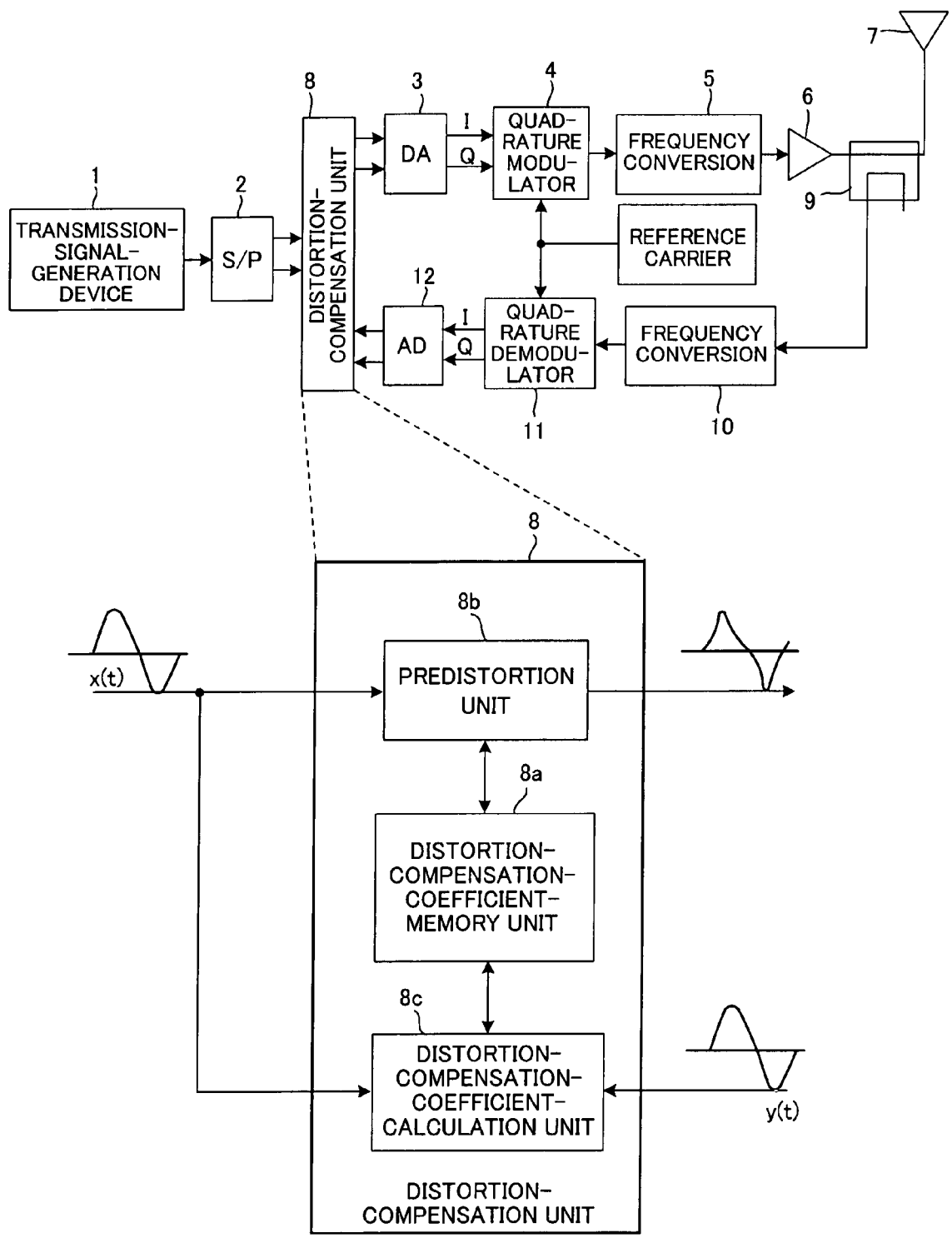
FIG. 11 is a block diagram of a transmission apparatus that has a digital non-linear distortion compensation function that uses a DSP.
Figure 12:
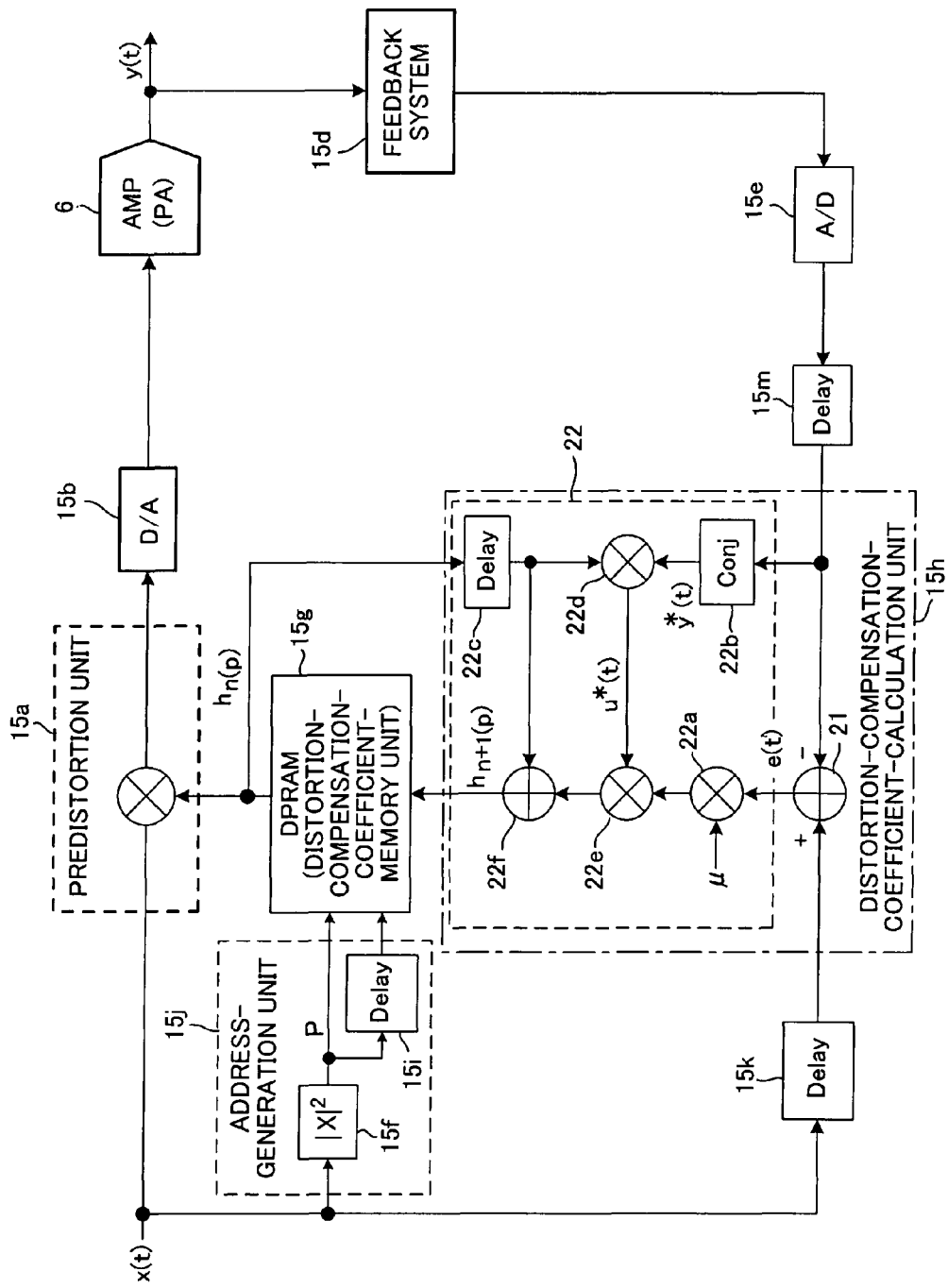
FIG. 12 is a drawing explaining the distortion compensation process by adaptive LMS.
Figure 13:
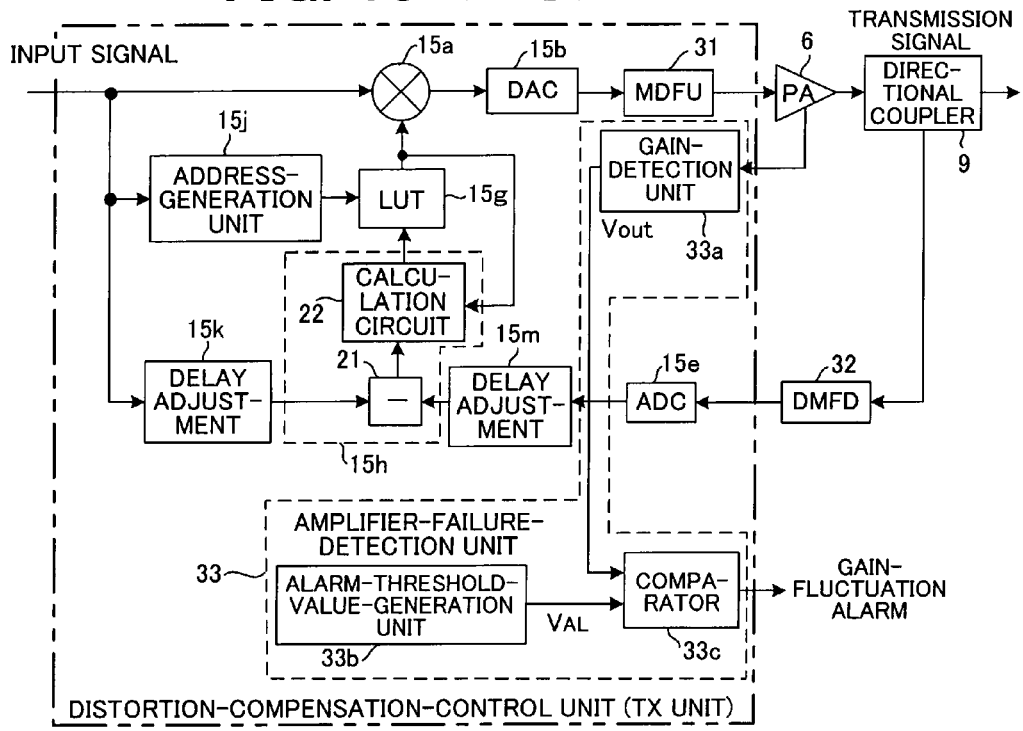
FIG. 13 is a drawing showing the construction of a transmission apparatus in a radio transmitter having an amplifier failure detection unit.

FIG. 8 is a flowchart showing the table-creation process and failure-detection process of this variation.

First, the alarm-threshold-value-table-creation unit 55 measures the gain-detection voltages Vout1, Vout2 of power amplifier 71 at addresses −25 and −12.5, or in other words, at input-amplitude levels −35 (dBm) and −22.5 (dBm) (step 701).

Next, the alarm-threshold-value-table-creation unit 55 calculates the alarm-threshold voltages for each division when shifted downward just the amount of gain drop $\alpha$ dB to be determined as failure (step 702). When an alarm is output at a gain drop amount $\alpha$ dB, it is possible to use the gain-monitor voltage Vout and the rate of change in gain-monitor voltage 0.06 to calculate the alarm-threshold voltage $V_{AL}$ for each division from the equation $$V_{AL} = 0.06 \times \alpha + V\text{out}$$

For example, in the case where an alarm is to be output for a gain drop of 3 dB, for Vout1=0.72, the alarm-threshold voltage $V_{AL1}$ of the division for addresses less than −12.5 becomes $$V_{AL1} = 0.06 \times (-3) + 0.72 = 0.54,$$

and for Vout2=0.81, the alarm-threshold voltage $V_{AL2}$ of the division for addresses greater than −12.5 becomes $$V_{AL2} = 0.06 \times (-3) + 0.81 = 0.63.$$

After that, the alarm-threshold-value-table-creation unit 55 correlates the alarm-threshold voltages for each division that were found in step 702 to the respective divisions and sets them in a table (step 703). From the above process, creation of the table is then complete.

In this state, a gain-detection unit 51 detects the gain of the power amplifier 71, and outputs a voltage signal (gain-monitor voltage) Vout that corresponds to that gain. An integrator 52 averages the input signal over a fixed amount of time and calculates the average input-amplitude level, then inputs that value to an alarm-threshold-value-generation unit 53. The alarm-threshold-generation unit 53 generates the alarm-threshold voltage $V_{AL}$ that corresponds to the division to which the average input-amplitude level belongs, and inputs it to a comparator 54 (step 704). The comparator 54 compares the gain-monitor voltage Vout that was detected by the gain-detection unit 51 with the alarm-threshold voltage $V_{AL}$, and based on the comparison result, or in other words, when Vout<$V_{AL}$, generates a gain-fluctuation alarm (step 705).

According to this variation, by dividing the range of input-amplitude levels into a plurality of divisions and creating a table that discretely stores alarm-detection levels that correspond to each division, it is possible with simple construction to accurately detect when failure of the power amplifier occurs.

As many apparently widely different embodiments of the present invention can be made without departing from the spirit and scope thereof, it is to be understood that the invention is not limited to the specific embodiments thereof except as defined in the appended claims.

What we claimed is:

1. An amplifier failure detection apparatus for a radio transmitter that compensates for amplifier distortion of the radio transmitter, and determines amplifier failure, the amplifier failure detection apparatus comprising:
    a gain-detection unit that detects a gain of the amplifier and outputs a voltage signal that corresponds to the gain;
    an alarm-detection-level-generation unit that generates an alarm-detection level that corresponds to an input-amplitude level of the amplifier; and
    a comparison unit that compares the level of the voltage signal output by the gain-detection unit with the alarm detection level, and generates an alarm that indicates failure of the amplifier based on the comparison results.

2. The amplifier failure detection apparatus of claim 1 wherein
    the alarm-detection-level-generation unit comprises a table that stores alarm-detection levels that correspond to the input-amplitude levels, and references that table to generate an alarm-detection level that corresponds to the input-amplitude level.

3. The amplifier failure detection apparatus of claim 1 wherein
    the alarm-detection-level-generation unit divides the range of input-amplitude levels into a plurality of divisions, then creates a table so that the alarm-detection level for each division is fixed, and references that table to generate an alarm-detection level that corresponds to the input-amplitude level.

4. The amplifier failure detection apparatus of claim 2 or claim 3 further comprising:
    a table-creation unit that creates the table, taking into consideration the gain characteristics with respect to the input-amplitude level of the amplifier when the amplifier is in a normal state.

5. The amplifier failure detection apparatus of claim 4 further comprising:
    a distortion-compensation-control unit that performs the distortion-compensation function of the amplifier, the distortion compensation control unit including: a distortion-compensation coefficient memory unit that stores a distortion-compensation coefficient for the input-amplitude level; a distortion-compensation unit that uses that distortion-compensation coefficient that corresponds to the input-amplitude level to compensate for the distortion of the amplifier; and a coefficient update unit that updates the distortion-compensation coefficient that is stored in the distortion-compensation-coefficient-memory unit; wherein
    the table-creation unit uses the distortion-compensation coefficient stored in the distortion-compensation-coefficient-memory unit to create the table.

6. The amplifier failure detection apparatus of claim 5 wherein
    the table-creation unit uses a distortion-compensation coefficient created during distortion training to create the table, and uses the updated distortion-compensation coefficient to update the table.

7. An amplifier failure detection method of an amplifier failure detection apparatus for a radio transmitter that compensates for amplifier distortion of the radio transmitter and determines amplifier failure, the method comprising:
    detecting a gain of the amplifier and outputting a voltage signal that corresponds to the gain;
    generating an alarm-detection level that corresponds to an input-amplitude level of the amplifier; and
    comparing the level of the voltage signal with the alarm detection level, and generating an alarm that indicates failure of the amplifier based on the comparison results.

* * * * *